United States Patent [19]
Toraguchi et al.

[11] Patent Number: 6,161,498
[45] Date of Patent: Dec. 19, 2000

[54] PLASMA PROCESSING DEVICE AND A METHOD OF PLASMA PROCESS

[75] Inventors: Makoto Toraguchi, Yokosuka; Satoru Kawakami, Sagamihara, both of Japan

[73] Assignees: Tokyo Electron Limited, Tokyo; Fuji Electric Co., Ltd., Kanagawa, both of Japan

[21] Appl. No.: 08/885,954

[22] Filed: Jun. 30, 1997

Related U.S. Application Data

[63] Continuation-in-part of application No. 08/713,468, Sep. 13, 1996, abandoned.

[30] Foreign Application Priority Data

| Sep. 14, 1995 | [JP] | Japan | 7-262260 |
| Nov. 20, 1996 | [JP] | Japan | 8-324784 |
| Jan. 11, 1997 | [JP] | Japan | 9-014721 |

[51] Int. Cl.[7] ................................................ C23C 16/511
[52] U.S. Cl. .................. 118/723 MW; 118/723 MR; 118/723 MA; 118/725
[58] Field of Search ............... 219/121.43, 696; 427/575; 118/723 MW, 723 MR

[56] References Cited

U.S. PATENT DOCUMENTS

| 4,915,979 | 4/1990 | Ishida et al. | 427/39 |
| 5,069,928 | 12/1991 | Echizen et al. | 427/45.1 |
| 5,153,406 | 10/1992 | Smith | 219/121.43 |
| 5,192,849 | 3/1993 | Moslehi | 219/121.43 |
| 5,389,154 | 2/1995 | Hiroshi et al. | 118/723 MR |
| 5,714,010 | 2/1998 | Matsuyama et al. | 118/723 MW |

*Primary Examiner*—Gregory Mills
*Assistant Examiner*—Rudy Zervigon
*Attorney, Agent, or Firm*—Oblon, Spivak, McClelland, Maier & Neustadt, P.C.

[57] ABSTRACT

Disclosed is a plasma process apparatus which permits generating microwaves and a magnetic field so as to bring about electron cyclotron resonance and, thus, to generate a plasma which is applied to a semiconductor wafer, comprising microwave generating means for generating said microwaves, microwave transmitting means for transmitting the microwaves, a process chamber having said semiconductor wafer arranged therein, the microwaves being introduced into said process chamber through said microwave transmitting means, process gas supply means for supplying a process gas into said process chamber, and magnetic field generating means for generating a magnetic field within the process chamber. The frequency of the microwave falls within a range between a lower limit of a cutoff frequency determined by the inner diameter of the process chamber and an upper limit of a maximum frequency at which a standing wave of the microwave does not occur on the surface of the object.

24 Claims, 4 Drawing Sheets

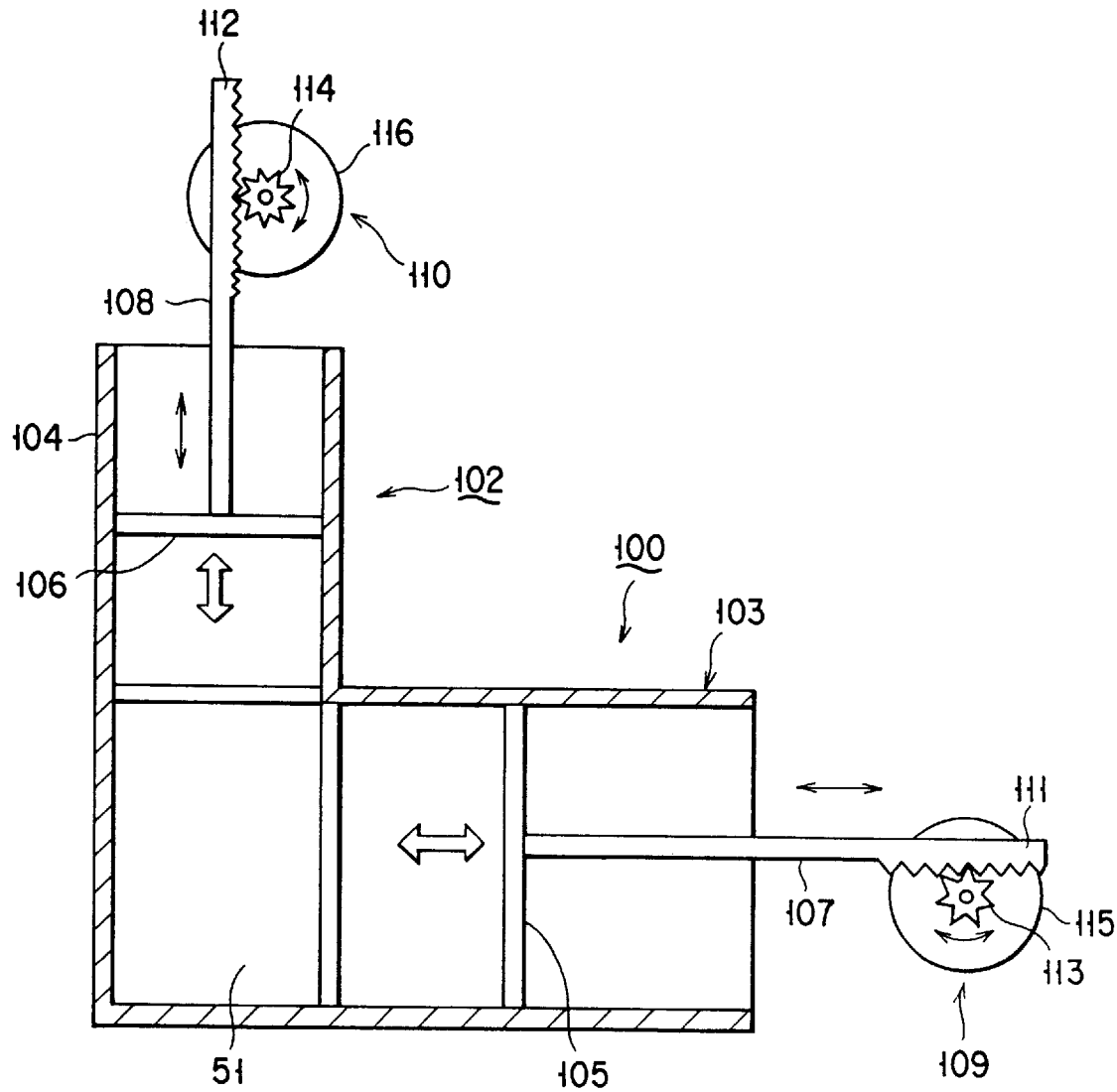
F I G. 4
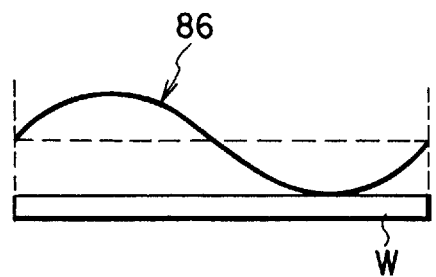
F I G. 5

PLASMA PROCESSING DEVICE AND A METHOD OF PLASMA PROCESS

CROSS-REFERENCE TO RELATED APPLICATIONS

This application is a continuation-in-part of U.S. patent application Ser. No. 08/713,468, filed Sep. 13, 1996, now abandoned.

BACKGROUND OF THE INVENTION

The present invention relates to a plasma processing device for subjecting an object such as a semiconductor wafer to a predetermined process such as film formation.

The invention also relates to a method of subjecting an object such as a semiconductor wafer to a predetermined process such as film formation by using a plasma.

With recent development in enhancing integration density and miniaturization of semiconductor products, plasma processing devices have been used in some cases in order to perform processes such as film formation, etching and ashing in steps of manufacturing the semiconductor products. In particular, a microwave plasma device tends to be used, since it can create a stable plasma even in a high vacuum state with a relatively low pressure of about 0.1 to 10 mTorr. In the microwave plasma processing device, a high-density plasma is created by combining microwaves and a magnetic field generated from a ring-shaped coil.

For example, there is known a conventional microwave plasma device wherein a plasma generating chamber having magnetic field generating means is provided with a microwave introducing port and an electron cyclotron resonance space is produced. Ions are extracted from the plasma generating chamber, and a process gas in a reaction chamber is activated by the plasma, thus performing various processes such as film formation.

FIG. 1 is a schematic diagram showing the structure of such a conventional plasma processing device. In the figure, a process chamber 11 is formed of, e.g. aluminum in a cylindrical shape. A table 12 for mounting of a semiconductor wafer W as an object to be processed is provided within the process chamber 11. An upper part of the process chamber 11 is narrowed in a stepwise fashion and a plasma chamber 13 is formed in the upper part. A reaction chamber 14 is formed below the plasma chamber 13.

A ceiling cover 15 of, e.g. quartz for sealing a ceiling portion of the process chamber 11 is airtightly provided on the upper part of the plasma chamber 13. The ceiling cover 15 constitutes a microwave introducing window 16. A conical taper waveguide 17 is connected in a member to face the microwave introducing window 16. A rectangular waveguide 18 is connected to a top portion of the taper waveguide 17. A microwave generator 19 for generating microwaves of, e.g. 2.45 GHz is provided on the rectangular waveguide 18. Microwaves generated by the microwave generator 19 are introduced into the plasma chamber 13 through the microwave introducing window 16 via the rectangular waveguide 18 and taper waveguide 17.

Ring-shaped main coils 20 and sub-coils 21 are disposed outside the plasma chamber 13 of process chamber 11 and below the bottom of the chamber, respectively. Each coil 20, 21 generates a downward magnetic field and thereby a downward mirror field is produced within the entire process chamber 11. In this case, the downward magnetic field and microwaves are set to meet the condition for electron cyclotron resonance. Specifically, if the frequency of microwaves is 2.45 GHz, the magnitude of the magnetic field is set at about 875 gauss.

Thus, the plasma gas, e.g. argon gas, introduced into the plasma chamber 13 is made into a plasma by electron cyclotron resonance caused by synergetic effect of applied microwaves and magnetic field. The generated plasma activates a process gas, e.g. silane gas and oxygen used as film formation gas, supplied to a lower part of the plasma chamber 13. The activated process gas reacts and a reaction product deposits on the surface of the wafer as a thin film.

In the meantime, when the condition for electron cyclotron resonance is satisfied, the frequency of microwaves and the magnitude of magnetic field are definitively determined by setting the potential, mass, etc. of charged particles. However, if the frequency of microwaves is set at 2.45 GHz, as mentioned above, the main coils 20 and the sub coils 21 for obtaining the corresponding field intensity of 875 gauss become very large in size. For example, the weight of the main coil 20 becomes 100 Kg or more. Consequently, the cost for the plasma processing device increases, the maintenance work for the plasma processing device is time-consuming and the space for installation of the apparatus cannot be decreased.

In particular, in the case of a plasma processing device for processing 12-inch wafers, the diameter of the table 12 further increases, as compared to the apparatus for processing 8-inch wafers. Consequently, the size of the coil further increases, and the weight thereof becomes, for example, about 200 Kg. Under the circumstances, with an increase in diameter of the wafer, there is a demand for reducing the size of the coil.

In addition, when microwaves are supplied into the process chamber 11, an impedance variation of the plasma will inevitably occur due to a variation, etc. in density of the generated plasma. Thus, all microwave power output from the microwave generator 19 is not supplied into the process chamber 11, and some reflection power will occur due to mismatching of impedance.

In this case, an effective power contributing to plasma generation is equal to a difference between the output power and reflection power. In the prior art, however, no measure is conducted to control reflection power, and only output power is controlled. Thus, different powers may be supplied to wafers, depending on the impedance state of plasma. Consequently, reproducibility of process may deteriorate.

Furthermore, such reflection power is wasted since it does not contribute to plasma generation. From the standpoint of power consumption, the presence of reflection power is not desirable.

BRIEF SUMMARY OF THE INVENTION

An object of the present invention is to provide a plasma process apparatus with a small-sized electromagnetic coil. Another object of the invention is to provide a plasma process apparatus capable of reducing reflection power of microwaves. Still another object of the invention is to provide a plasma process method in which a small-sized coil can be used. Still another object of the invention is to provide a plasma process method capable of reducing reflection power of microwaves.

According to an aspect of the present invention, there is provided a plasma process apparatus which permits generating microwaves and a magnetic field so as to bring about electron cyclotron resonance and, thus, to generate a plasma which is applied to an object to be processed, comprising:

microwave generating means for generating said microwaves;

microwave transmitting means for transmitting the microwaves;

a process chamber having said object arranged therein, the microwaves being introduced into said process chamber through said microwave transmitting means;

process gas supply means for supplying a process gas into said process chamber; and magnetic field generating means for generating a magnetic field within the process chamber, wherein the frequency of the microwave falls within a range between a lower limit of a cutoff frequency determined by the inner diameter of the process chamber and an upper limit of a maximum frequency at which a standing wave of the microwave does not occur on the surface of the object.

This invention also provides a plasma process apparatus for processing an object by using a plasma produced by electron cyclotron resonance which is caused by generating microwaves and producing a magnetic field, said apparatus comprising:

microwave generating means for generating the microwaves;

microwave transmission means for transmitting the microwaves;

a process chamber in which the microwaves are introduced via the microwave transmission means and said object is disposed;

process gas supply means for supplying a process gas into the process chamber;

magnetic field generating means for generating a magnetic field in the process chamber; and matching means for freely varying the impedance of the microwaves in the microwave transmission means, wherein said matching means varies the impedance of the microwaves in the microwave transmission means so as to substantially eliminate reflection waves from the process chamber.

According to another aspect of the present invention, there is provided a plasma process method using a plasma process apparatus comprising microwave generating means for generating said microwaves, microwave transmitting means for transmitting the microwaves, a process chamber having said object arranged therein, the microwaves being introduced into said process chamber through said microwave transmitting means, process gas supply means for supplying a process gas into said process chamber, and magnetic field generating means for generating a magnetic field within the process chamber, comprising the steps of:

allowing said microwave generating means to generate microwaves;

introducing said microwaves into said process chamber through said microwave transmitting means; and allowing said magnetic field generating means to generate a magnetic field within the process chamber so as to permit the microwaves and the magnetic field to bring about an electron cyclotron resonance and, thus, to generate a plasma which is applied to the object, wherein the frequency of the microwave falls within a range between a lower limit of a cutoff frequency determined by the inner diameter of the process chamber and an upper limit of a maximum frequency at which a standing wave of the microwave does not occur on the surface of the object.

This invention also provides a plasma process method using a plasma process apparatus comprising microwave generating means for generating the microwaves, microwave transmission means for transmitting the microwaves, a process chamber in which the microwaves are introduced via the microwave transmission means and an object is disposed, process gas supply means for supplying a process gas into the process chamber, magnetic field generating means for generating a magnetic field in the process chamber, and matching means for freely varying the impedance of the microwaves in the microwave transmission means, said process comprising the steps of:

generating the microwaves by said microwave generating means;

introducing the microwaves into the process chamber via the microwave transmission means; and producing the magnetic field in the process chamber by the magnetic field generating means, and causing electron cyclotron resonance of the microwaves and the magnetic field, thereby producing a plasma and processing the object with use of the plasma, wherein said matching means varies the impedance of the microwaves in the microwave transmission means so as to substantially eliminate reflection waves from the process chamber.

In the plasma process apparatus and plasma process method of the present invention, the frequency of the microwave applied to the object is defined to fall within a range between a lower limit of a cutoff frequency and an upper limit of a maximum frequency at which a standing wave of the microwave does not occur on the surface of the object. The particular definition permits lowering the intensity of the magnetic field satisfying the condition of the electron cyclotron resonance, making it possible to miniaturize the electromagnetic coil. As a result, the plasma process apparatus can be miniaturized, leading to saving of the space.

BRIEF DESCRIPTION OF THE SEVERAL VIEWS OF THE DRAWING

FIG. 4 is a cross-sectional view of the EH tuner shown in FIG. 3; and

FIG. 5 shows how a standing wave is formed on a semiconductor wafer.

DETAILED DESCRIPTION OF THE INVENTION

An embodiment of the present invention will now be described with reference to the drawings.

Figure 1:
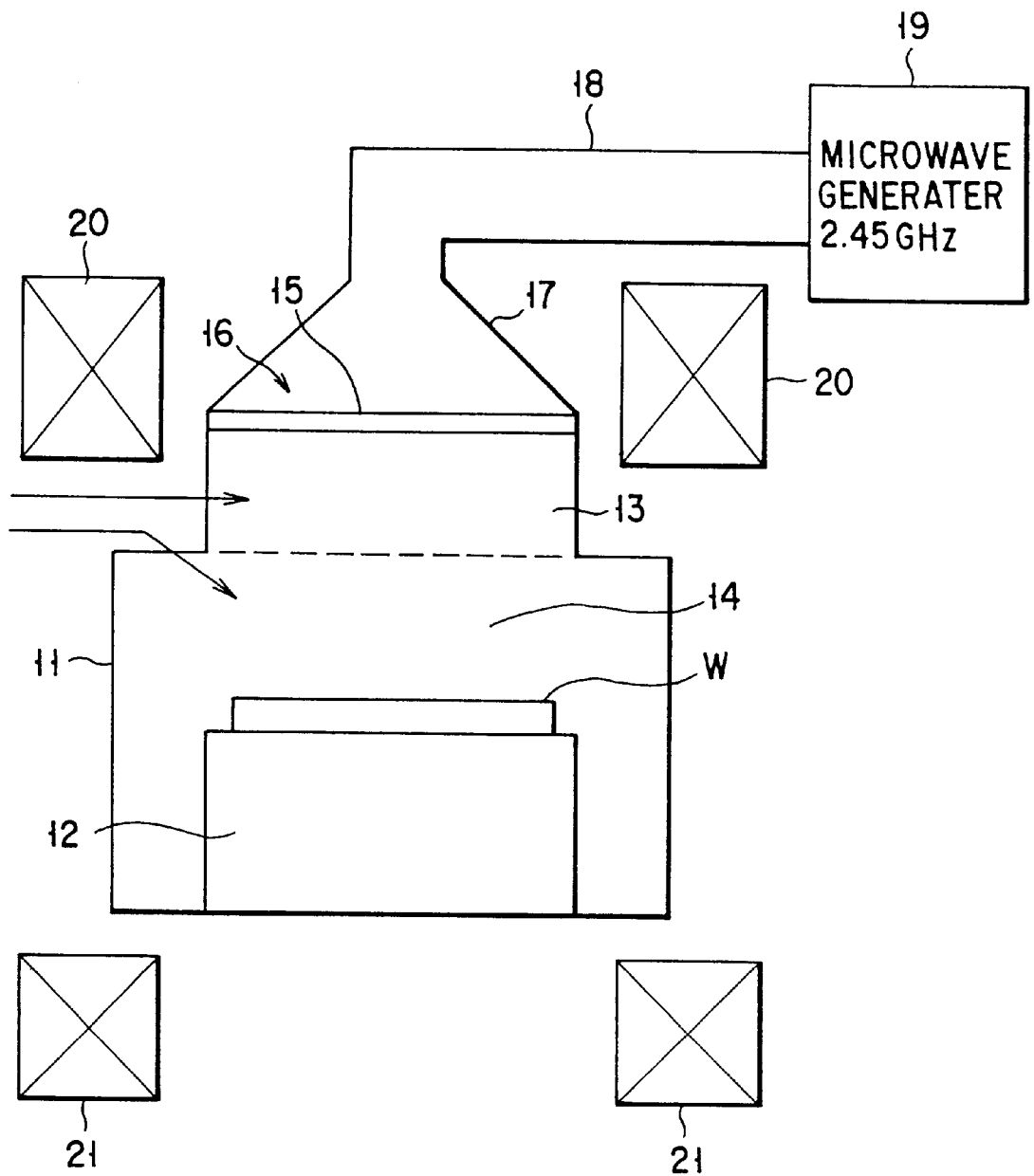
FIG. 1 schematically shows a conventional plasma processing device.
Figure 2:
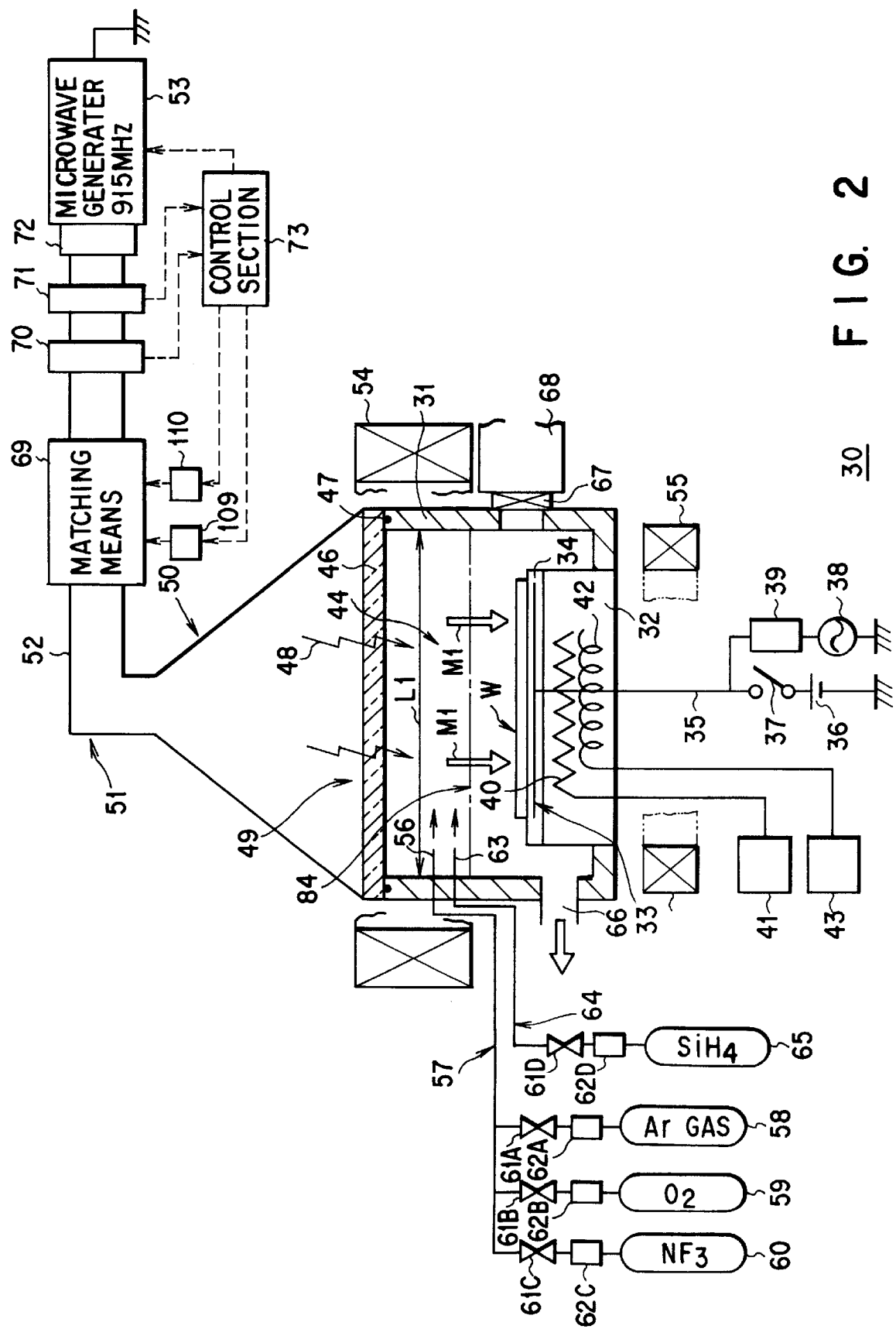
FIG. 2 schematically shows an embodiment of a plasma processing device according to the present invention.
Figure 3:
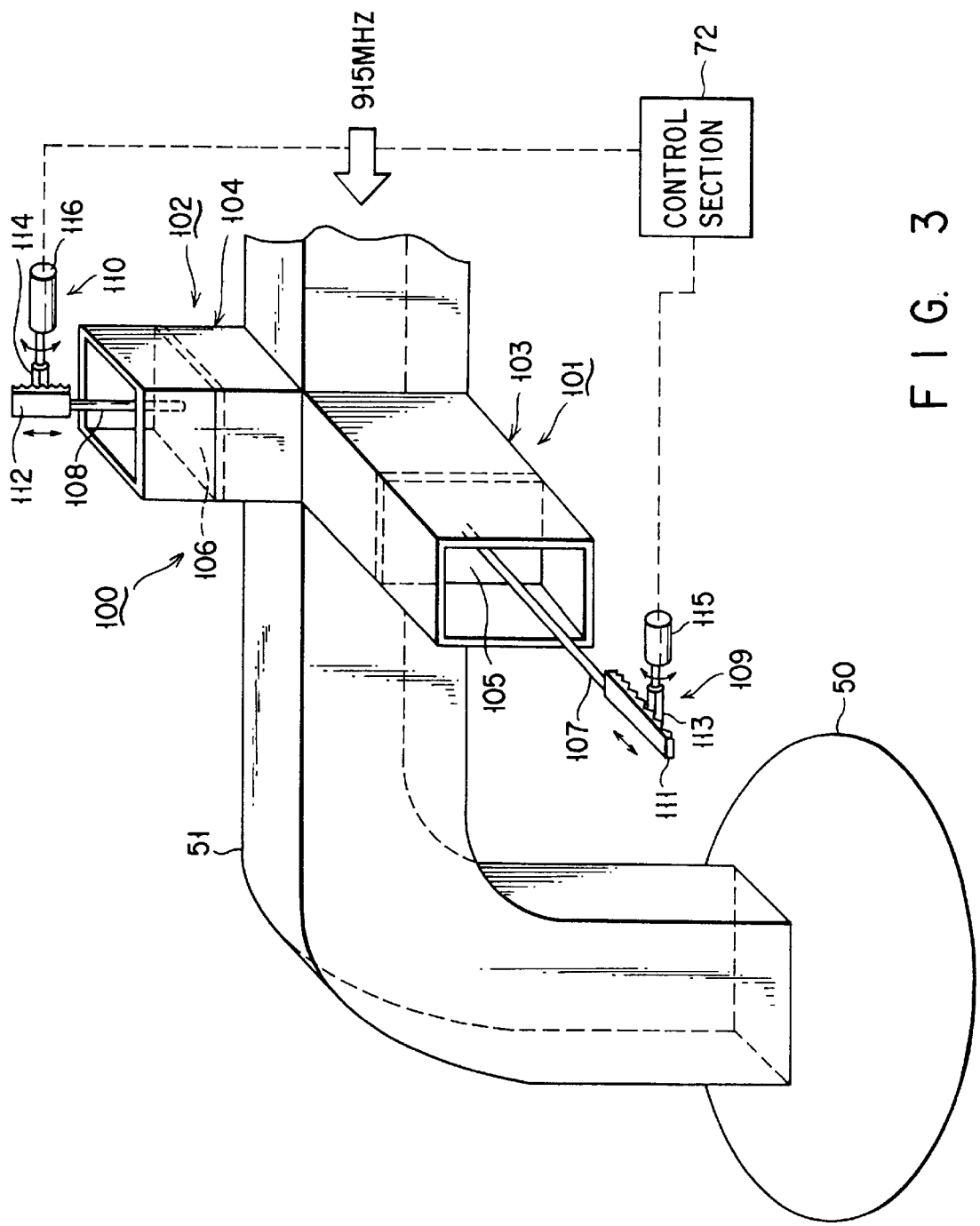
FIG. 3 is a perspectively view showing an EH tuner as an example of matching means of the plasma processing device shown in FIG. 2.

FIG. 2 is a cross-sectional view showing an example of a plasma process apparatus according to the present invention, FIG. 3 is a perspective view showing a microwave introducing system of the plasma process apparatus shown in FIG. 2, and FIG. 4 is a cross-sectional view showing matching means.

In this embodiment, an electron cyclotron resonance (ECR) plasma CVD apparatus is used as an example of the plasma process apparatus. The plasma process apparatus 30 shown in FIG. 2 has a process chamber 31. The process chamber 31 is formed substantially of, e.g. aluminum and has a cylindrical shape.

A table 32 formed of, e.g. aluminum for mounting of a semiconductor wafer W as an object to be processed is disposed at a bottom portion of the process chamber 31. An electrostatic chuck 34 formed of, e.g. polyimide resin in which a disk-like copper foil 33 is buried is attached to an upper surface of the table 32. A DC power supply 36 is connected to the copper foil 33 via a power line 35. A switch 37 is provided on the power line 35. A bias radio-frequency power supply 38 of, e.g. 13.56 MHz is connected in parallel to the DC power supply 36 via a matching box 39. When the switch 37 is turned on, a high DC voltage is supplied to the electrostatic chuck 34 and the wafer W is attracted and held by a produced coulomb force. A bias radio-frequency power is applied to the electrostatic chuck 34, thereby efficiently attracting ions.

A cooling jacket 40 for cooling the wafer W is provided within the table 32, thereby to prevent the wafer W from being excessively heated at the time of plasma process. The jacket 40 is connected to a refrigerant source 41. A heater 42 for heating the wafer W, where necessary, is provided within the table 32. The heater 42 is connected to a heating source 43.

A reaction chamber 44 having an open ceiling is formed above the table 32 arranged within the process chamber 31. A ceiling cover 46 formed of a dielectric body such as aluminum nitride (AlN) is hermetically provided on the ceiling portion via a seal member 47 such as an O-ring, thus constituting a microwave introducing window 49 through which microwaves 48 pass.

A conical taper waveguide 50 is connected to the microwave introducing window 49. The waveguide 50 is connected to a rectangular waveguide 52 having a rectangular cross section via a conversion waveguide 51 for converting the vibration mode of the microwave. Further, the rectangular waveguide 52 is connected to a microwave generator 53 via a matching circuit 69 for performing an impedance matching. It follows that the microwave generated within the microwave generator 53 is introduced into the reaction chamber 44.

The frequency of the microwave generated from the microwave generator 53 is set to fall within a range between a lower limit of the cutoff frequency determined by an inner diameter L1 of the reaction chamber 44 and an upper limit of a maximum frequency at which a standing wave of the microwave does not occur on the surface of the semiconductor wafer W. It should be noted concerning the lower limit of the frequency range given above that the frequency of the microwave is proportional to the intensity of the magnetic field under the state satisfying the electron cyclotron resonance conditions. Naturally, a magnetic field of a higher intensity is required with increase in the frequency of the microwave, making it necessary to use a larger electromagnetic coil. Also, the weight of the coil is increased with increase in the size of the coil.

Further, if a standing wave of the microwave is formed on the surface of the wafer, distribution of electric field is brought about on the wafer surface, with the result that the wafer cannot be processed uniformly. What should also be noted is that, if the frequency of the microwave is lower than the cutoff frequency determined, the microwave cannot be introduced into the process chamber 31 and, thus, an electric power cannot be supplied to the process chamber 31. In the present invention, the frequency of the microwave is determined as described previously in view of these contradictory requirements.

The upper limit in the frequency of the microwave is 1.5 GHz where the wafer is sized at 8 inches and 1.0 GHz where the wafer is sized at 12 inches. On the other hand, the lower limit in the frequency of the microwave depends on the wafer size and oscillation mode of the microwave. Where the wafer is sized at, for example, 8 inches, the lower limit is 580 MHz under the microwave oscillation mode of TE 11 mode and 770 MHz under TM 01 mode. Where the wafer is sized at 12 inches, the lower limit is 440 MHz under TE 11 mode and 570 MHz under TM 01 mode. Clearly, the frequency of the microwave used in the present invention is markedly lower than that of the microwave widely used in this technical field, i.e., 2.45 GHz.

In the embodiment shown in the accompanying drawings, the industrial frequency of 915 MHz, which falls within the range specified in the present invention in respect of the wafer sizes exemplified above, is used as the frequency of the microwave. Also, the inner diameter L1 of the process chamber 31 is set to be larger in general by about 10 cm than the wafer size. For example, the inner diameter L1 is set at about 300 mm where the wafer is sized at 8 inches and at about 400 mm where the wafer is sized at 12 inches.

A main electromagnetic coil 54 is wound about the outer surface in an upper portion of the process chamber 31 such that the reaction chamber 44 is defined in the upper portion of the process chamber 31 by the magnetic fluxes generated from the coil 54. In addition, with the reaction chamber 44 interposed, the annular sub-electromagnetic coil 55 is provided below the bottom portion of the process chamber 31. The coils 54 and 55 produce a downward mirror magnetic field M1 within the plasma chamber 44 and reaction chamber 44, thereby effectively enclosing ions. With the magnetic field M1 and supplied microwaves, electron cyclotron resonance occurs to generate a plasma.

A plasma gas introducing nozzle 56 is provided on the size wall defining the plasma chamber 44. The nozzle 56 is connected via a gas passage 57 to an Ar gas source 58, an oxygen gas source 59 and a cleaning gas source, e.g. $NF_3$ gas source 59. The gas sources 57, 58 and 59 are provided with opening/closing valves 61A, 61B and 61C and mass-flow controllers 62A, 62B and 62C, respectively, so that the flow rates of gases from the gas sources 57, 58 and 59 can be controlled.

In addition, a process gas introducing nozzle 63 is provided on the wall defining the reaction chamber 44. The nozzle 62 is connected to a process gas source, e.g. silane gas source 65 via a gas passage 64. The flow rate of the process gas is controlled by an opening/closing valve 61D and a mass-flow controller 62D provided midway along the gas passage 64. An exhaust port 66 for creating a vacuum within the process chamber 31, which is connected to a vacuum pump (not shown), is made in the side wall of the reaction chamber 44 of process chamber 31. The side wall of the reaction chamber 44 is connected to a load/lock chamber 68 via a gate valve 67.

On the other hand, matching means 69, reflection power measuring unit 70 and an output power measuring unit 71 are provided on the rectangular waveguide 52 successively from the plasma chamber (44) side. The matching means 69 adjusts the impedance of the rectangular waveguide 52 in order to eliminate power of microwaves reflected from the plasma chamber 44 ("reflection waves" hereinafter), that is, reflection power. The reflection power measuring unit 70 measures reflection power. On the other hand, the output power measuring unit 71 measures microwave power output from the microwave generator 53, i.e. output power. The microwave generator 53 is connected to the rectangular waveguide 52 via an insulating member 72 for preventing reflected microwaves from entering the plasma generator 52.

The matching means 69 is electrically connected to a control section 73 comprising, e.g. a microcomputer. The control section 73 controls the matching means 69 on the basis of a measurement value obtained from the reflection power measuring unit 70.

Specifically, an EH tuner 100, as shown in FIGS. 3 and 4, can be used as matching means 69. The EH tuner 100 serving as matching means 69 comprises an electric field plane adjusting unit 101 for adjusting the electric field (E) plane of the rectangular waveguide 51, and a magnetic field adjusting unit 102 for adjusting the magnetic field (H) plane perpendicular to the electric field plane. The respective units 101 and 102 have an electric field adjusting pipe 103 and a magnetic field adjusting pipe 104 with rectangular cross sections, which are branched to communicate with each other perpendicularly to the rectangular waveguide 51. Short plates 105 and 106 are provided in the adjusting pipes 103 and 104 respectively such that the short plates 105 and 106 are put in contact with the inner walls of the respective pipes 103 and 104 so as to be movable in the longitudinal direction. Accordingly, the short plates 105 and 106 are properly moved within the adjusting pipes 103 and 104, thereby adjusting the electric field plane and magnetic field plane and varying the impedance.

The short plates 105 and 106 are coupled to slide arms 107 and 108, respectively. The arms 107 and 108 are coupled to an electric field plane moving mechanism 109 and a magnetic field plane moving mechanism 110. The moving mechanisms 109 and 110 comprise, respectively, racks 111 and 112 provided at end portions of the arms 107 and 108, pinions 113 and 114 meshed with the racks 111 and 112, and step motors 115 and 116 serving as drive means for rotating the pinions 113 and 114 forwardly and reversely.

As is shown in FIG. 3, the moving mechanisms 109 and 110 adjust the positions of the short plates 105 and 106 in response to commands from the control section 73 so that reflection power becomes substantially zero. In this case, in order to obtain optimal positions of the short plates, a plasma is actually created in advance and the respective short plates are moved bit by bit. The positions at which reflection power becomes substantially zero are plotted for mapping. The mapping data is stored, e.g. in a storage (not shown) in the control section 73. The structures of the moving mechanisms 109 and 110 are not limited to the above-described, if the positions of the short plates 105 and 106 can be adjusted.

A directional coupler, for example, can be used as reflection power measuring unit 70.

A measurement value obtained in the output power measuring unit 71 may be input to the control section 73. On the basis of the measurement value, the control section 73 controls the output of the microwave generator 53 so that an effective power or a difference between output power and reflection power, that is, power actually input to the process chamber 31, may be set at a predetermined value.

A description will now be given of the steps of processing the semiconductor wafer W with use of a plasma by means of the plasma process apparatus 30 according to the present embodiment having the above structure.

A non-processed semiconductor wafer W with a diameter of 12 inches is carried from the load/lock chamber 68 into the reaction chamber 44 of process chamber 31 and placed on the table 32. The wafer W is attracted and held on the table 32 by a coulomb force of the electrostatic chuck 34.

The process chamber 32 is hermetically closed and evacuated. If the inside of the process chamber 31 has reached a predetermined degree of vacuum, the Ar gas, $O_2$ gas and the material gas or silane gas are supplied into the process chamber 31 from the respective gas sources 57, 58 and 59, and the process chamber 31 is kept at a predetermined process pressure, e.g. about 1 mTorr.

At the same time, microwaves generated from the microwave generator 53 are propagated through the rectangular waveguide 52 and taper waveguide 50 and introduced into the plasma chamber 44 via the microwave introducing window 49. Further, the main electromagnetic coil 54 and sub-electromagnetic coil 55 are driven to produce a mirror magnetic field M1 directed downward within the process chamber 32.

Synergetic effect of the mirror magnetic field M1 and supplied microwaves 48 causes electron cyclotron resonance. Thereby, argon gas in the plasma chamber 44 is made into a plasma, and ions are generated. The generated ions are supplied toward the reaction chamber 44 along the downward mirror magnetic field M1. The oxygen and silane gas are activated by the plasma energy of the ions. Thus, sputtering is effected on the surface of the semiconductor wafer W and at the same time a film of $SiO_2$ is formed on the surface of the wafer W.

At this time, a bias voltage is applied from the bias radio-frequency power source 38 to the copper foil 33 in the electrostatic chuck 34. Thus, ions are efficiently attracted onto the surface of the semiconductor wafer W.

The plasma-state charged particles absorb microwaves resonating with cyclotron frequency so as to make a circular motion and to be attracted toward the wafer. In this embodiment, the frequency of the microwave is set to fall within a range between a lower limit of a cutoff frequency determined by the inner diameter L1 of the process chamber 31 and an upper limit of a maximum frequency at which a standing wave of the microwave does not occur on the wafer surface. It is possible to set the particular frequency at, for example, 915 MHz, which is an industrial frequency and is markedly lower than the frequency, 2.45 GHz, of the microwave used in the conventional apparatus. In addition, the plasma density is hardly lowered in the present invention in spite of the use of the industrial frequency noted above. It should be noted that the magnetic field intensity meeting the electron cyclotron condition for the frequency of 2.45 GHz (wavelength of 122 mm) is about 875 gauss. On the other hand, the magnetic field intensity meeting the electron cyclotron condition for the frequency of 915 MHz (wavelength of 329 mm) is about 326.8 gauss. Since the frequency of the microwave defined in the present invention permits markedly lowering the magnetic field intensity as pointed out above, it is possible to diminish the main electromagnetic coil 54 and the sub-electromagnetic coil 56.

The frequency range of the microwave defined in the present invention is very important. As already pointed out, the cutoff frequency determined by the inner diameter L1 of the process chamber 31 constitutes the lower limit of the frequency range in the present invention. In order to permit an effective absorption of the microwave for the plasma generation, it is necessary to transmit the microwave deep into the process chamber 31 to reach a horizontal level 84, which is called an ECR plane and at which is positioned the lower end of the main electromagnetic coil 54. It is ideal for the microwave transmitted through the tapered waveguide 50 to pass through the ceiling cover 46 made of AlN so as to be introduced into the process chamber 31 such that the microwave transmitted deep into the process chamber 31 is to be absorbed substantially completely at the ECR plane 84. It follows that the upper portion of the process chamber 31 forming the reaction chamber 44 is required to perform the function of a waveguide. In other words, the microwave must be transmitted through the reaction chamber 44 without attenuation. To enable the microwave to be transmitted through the reaction chamber 44 without attenuation, the frequency of the microwave must be higher than the cutoff frequency.

The cutoff frequency is dependent on the inner diameter of a circular waveguide, i.e., waveguide having a circular cross section, and on the oscillation mode of the microwave. In this embodiment, the process chamber 31 performs the function of a circular waveguide. It follows that the cutoff frequency fc, which is dependent on the inner diameter L1 of the process chamber 31 and on the oscillation mode of the microwave, can be represented by formula (1) given below:

$$fc = 1/\lambda c = 1/(A \times a) \tag{1}$$

where, "$\lambda c$" is a cutoff wave length; "A" is a waveguide constant which is dependent on the oscillation mode; and "a" is the inner diameter of the waveguide. In this embodiment, a=L1/2.

Incidentally, the waveguide constant noted above is referred to as $\lambda c/a$ in Appendix 5 (item 247) of "Microwave Circuit" published by Nikkan Kogyo Newspaper Inc. on Feb. 28, 1969. According to Appendix 5 noted above, the waveguide constant is 3.413 where the microwave is oscillated in TE 11 mode, and 2.613 where the microwave is oscillated in TM 01 mode.

Suppose the inner diameter L1 of the process chamber for processing wafers each sized at 8 inches (about 20 cm) is set to be larger by about 100 mm than the wafer diameter. In this case, the inner diameter L1 is 0.3 m. In this case, the cutoff frequency fc in this case is about 580 MHz where the microwave is oscillated in TE11 mode and about 770 MHz where the microwave is oscillated in TM 01 mode.

Suppose the inner diameter L1 of the process chamber for processing wafers each sized at 12 inches (about 30 cm) is set to be larger by about 100 mm than the wafer diameter. In this case, the inner diameter L1 is 0.4 m. The cutoff frequency fc in this case is about 440 MHz where the microwave is oscillated in TE 11 mode and about 570 MHz where the microwave is oscillated in TM 01 mode. The cutoff frequency noted above is the lower limit of the frequency range specified in the present invention.

In the above description, the inner diameter L1 of the process chamber is set to be larger by about 100 mm, which is an allowance, than the wafer diameter. However, the allowance can be set either larger or smaller than 100 mm. Of course, the lower limit of the frequency range is changed in accordance with changes in the allowance in question. As apparent from formula (1), the lower limit of the frequency range is increased with decrease in the allowance, and vice versa.

Let us explain the upper limit of the frequency range specified in the present invention with reference to FIG. 5. If a standing wave 86 covering a length equal to a single wavelength thereof is formed on the wafer surface as shown in the drawing, an electrical potential distribution is brought about on the wafer surface. As a result, nonuniformity in the plasma processing is rendered serious so as to impair the uniformity in the thickness of the film formed on the wafer surface. Naturally, it is important to prevent a standing wave covering a length of a single wavelength thereof from being formed on the wafer surface. The frequency of the microwave effective for preventing formation of the particular standing wave is 1.5 GHz where the wafer is sized at 8 inches, and is 1.0 GHz where the wafer is sized at 12 inches. Of course, the frequency noted above constitutes the upper limit of the frequency range specified in the present invention. Needless to say, a microwave having a frequency of 915 MHz, which is the industrial frequency referred to previously, can be used satisfactorily in respect of the wafers sized at 8 inches and 12 inches.

Where the frequency of the microwave is set at 915 MHz, the lower limit in the diameter L1 of the process chamber, which is calculated by formula (1) referred to previously, is about 25 cm when the microwave is oscillated in TM 01 mode.

As described above, the frequency of the microwave used in the present invention can be set markedly lower than 2.45 GHz as in the prior art, making it possible to lower the magnetic field intensity meeting the ECR resonance conditions. It follows that the present invention permits miniaturizing the electromagnetic coils 54 and 55.

In the present invention, a microwave of any frequency can be used effectively if the reaction chamber is sealed sufficiently, as far as the frequency falls within the particular range. In other words, the frequency need not be limited to the industrial frequency of 915 MHz. With decrease in the frequency within the particular range, the required magnetic field intensity can be lowered, leading to miniaturization of the electromagnetic coils used in the plasma process apparatus.

In general, all microwaves generated by the microwave generator 53 are not input to produce a plasma. The impedance of the plasma varies, and part of power is reflected and rendered non-effective in accordance with the reflection coefficient of the transmission system including the plasma. However, in the plasma process using the plasma process apparatus 30 according to the present embodiment, the electric field plane and magnetic field plane are adjusted by the matching means 69 provided on the rectangular waveguide 51, thereby to vary the impedance of the rectangular waveguide 51. Accordingly, it is possible to vary the impedance of the rectangular waveguide 52 by the matching means 69, thereby reducing the reflection power to substantially zero and making the impedance of the rectangular waveguide 52 substantially equal to the impedance of the plasma. In other words, it is possible to effect impedance matching, thereby reducing the non-effective output of microwaves to substantially zero.

More specifically, as mentioned above, the matching data, which has been obtained by displacing the positions of the short plates 105 and 106 of the magnetic field plane adjusting units 101 and 102 and measuring the reflection power during this time, is stored in the control section 73. In operation of the apparatus, the control section 73 determines the positions of the short plates 105 and 106 on the basis of the mapping data, and the short plates 105 and 106 are moved to the determined positions by the electric field plane moving mechanisms 109 and 110.

In this case, the reflection mode of microwaves may become different from that at the time of mapping owing to errors or various conditions. Thus, the presence/absence of reflection power is measured by the reflection power measuring unit 70 at all times, and the measurement signal is input to the control section 73 as feedback signal. Based on the feedback signal, the control section 73 further adjusts the positions of the short plates 105 and 106, thereby effecting impedance matching more exactly and eliminating reflection power without fail. According to the plasma process method using the plasma process apparatus 30 of this embodiment, since the occurrence of non-effective power noncontributing to the making of a plasma can be reduced as much as possible, useless power consumption is reduced and the power is saved.

In the plasma process apparatus 30 of this embodiment, the reflection power is monitored by the reflection power measuring unit 70 and at the same time the output power from the microwave generator 53 is measured and monitored by the output power measuring unit 71 at all times. In this case, since the effective power input to the process chamber 31 is equal to a difference between the output power and reflection power, the control section 73 controls the microwave output from the microwave generator 53 so that the effective power becomes constant during the process. Even if reflection power occurs, the effective power can, therefore, be made constant at all times, and the reproducibility of process mode is enhanced. Accordingly, uniform processing is achieved among wafers W. In the case of this embodiment, uniform thickness of $SiO_2$ films can be obtained.

As the film forming process is continued, a great deal of $SiO_2$ film adheres uselessly to such parts as the inner walls of the reaction chamber 44 of process chamber 31. The excess $SiO_2$ film, if removed, will result in particles. To solve this problem, a cleaning operation for removing excess $SiO_2$ film may be performed by flowing a cleaning gas such as $NF_3$ into the process chamber 31. In this case, if the ceiling cover 46 constituting the microwave introducing window 49 is formed of quartz ($SiO_2$), not only the unnecessary $SiO_2$ film is removed but also the ceiling cover 46 is cut in a dome shape by $NF_3$ gas.

If the ceiling cover 46 is cut in a dome shape and deformed, the mode of propagation of microwaves into the process chamber 31 slightly varies, resulting in degradation of reproducibility of process mode.

In the present embodiment, it is desirable that an insulating material having a low etching rate to a fluorine-based gas, a proper dielectric constant and a relatively high heat conductivity be used as material of the ceiling cover 46. Examples of such material are aluminum nitride (AlN) and alumina ($Al_2O_3$). In particular, AlN is excellent in consideration of the above properties.

If AlN is used as material of the ceiling cover 46, it is not so greatly cut by the cleaning gas of $NF_3$. Thus, the frequency of replacement can be reduced and the degree of deformation is low, as compared to the case of using quartz. Therefore, the reproducibility of process mode is good, and high uniformity of processing among wafers W can be maintained. In addition, since AlN has relatively high heat conductivity, heat is efficiently transmitted to the process chamber 31 and no conspicuous deviation arises in a heat distribution within the process chamber 31.

In the present embodiment as described above, silane is used as film formation gas. The film formation gas is not limited to this and may be disilane, etc. Besides, the seed for film formation is not limited to $SiO_2$ and may be $SiN_4$.

In the plasma process apparatus 30 according to the present embodiment, a plasma is produced by mirror magnetic field. This invention, however, may be applied to an apparatus for producing a plasma by cusp magnetic field.

In the present embodiment, an ECR type plasma CVD apparatus is exemplified as plasma process apparatus 30. This invention, however, is applicable to, e.g. a plasma ashing apparatus or a plasma etching apparatus.

The object to be processed by the plasma process apparatus of this invention is not limited to the semiconductor wafer W, and may be an LCD substrate, for instance.

We claim:

1. A plasma process apparatus which permits generating microwaves and a magnetic field so as to bring about electron cyclotron resonance and, thus, to generate a plasma which is applied to an object to be processed, comprising:

microwave generating means for generating said microwaves;

microwave transmitting means for transmitting the microwaves;

a process chamber having said object arranged therein, the microwaves being introduced into said process chamber through said microwave transmitting means;

process gas supply means for supplying a process gas into said process chamber; and magnetic field generating means for generating a magnetic field within the process chamber, wherein the frequency of the microwave falls within a range between a lower limit of a cutoff frequency determined by the inner diameter of the process chamber and an upper limit of a maximum frequency at which a standing wave of the microwave does not occur on the surface of the object, wherein the upper limit and the lower limit in the frequency range of the microwave are 1.5 GHz and 580 MHz, respectively, where the diameter of the object to be processed is 8 inches and the microwave oscillates in TE 11 mode within the process chamber, wherein the microwave transmitting means is provided with matching means for freely varying the impedance of the microwaves in the microwave transmitting means, and wherein said matching means comprises first and second adjustment pipes connected to said transmitting means having adjustable respective first and second plates disposed perpendicular to each other.

2. The apparatus according to claim 1, wherein the microwave has a frequency of 915 MHz.

3. The apparatus according to claim 1, wherein the microwave transmitting means is provided with reflection power measuring means for measuring power of reflection waves from the process chamber, said matching means is controlled on the basis of measurement values obtained by the reflection power measuring means, and the impedance of the microwave transmitting means is varied so as to substantially eliminate power of the reflection waves.

4. The apparatus according to claim 1, wherein the matching means is provided with an electric field plane adjusting unit and a magnetic field plane adjusting unit which have, respectively, adjustment pipes comprising said first and second adjustment pipes connected to a rectangular waveguide to correspond to electric and magnetic field planes perpendicular to each other, and short plates comprising said first and second plates provided movably along the insides of the adjustment pipes.

5. The apparatus according to claim 4, wherein the matching means is provided with moving mechanisms for moving the short plates along the insides of the adjustment pipes.

6. The apparatus according to claim 5, wherein the microwave transmitting means is provided with reflection power measuring means for measuring power of reflection waves from the process chamber, said moving mechanisms are controlled on the basis of measurement values obtained by the reflection power measuring means, and the impedance of the microwave transmitting means is varied so as to substantially eliminate power of the reflection waves.

7. A plasma process apparatus which permits generating microwaves and a magnetic field so as to bring about electron cyclotron resonance and, thus, to generate a plasma which is applied to an object to be processed, comprising:

microwave generating means for generating said microwaves; microwave transmitting means for transmitting the microwaves;

a process chamber having said object arranged therein, the microwaves being introduced into said process chamber through said microwave transmitting means;

process gas supply means for supplying a process gas into said process chamber; and magnetic field generating means for generating a magnetic field within the process chamber, wherein the frequency of the microwave falls within a range between a lower limit of a cutoff frequency determined by the inner diameter of the process chamber and an upper limit of a maximum frequency at which a standing wave of the microwave does not occur on the surface of the object, wherein the upper limit and the lower limit in the frequency range of the microwave are 1.5 GHz and 770 MHz, respectively, where the diameter of the object to be processed is 8 inches and the microwave oscillates in TM 01 mode within the process chamber, wherein the microwave transmitting means is provided with matching means for freely varying the impedance of the microwaves in the microwave transmitting means, and wherein said matching means comprises first and second adjustment pipes connected to said transmitting means having adjustable respective first and second plates disposed perpendicular to each other.

8. The apparatus according to claim 7, wherein the microwave has a frequency of 915 MHz.

9. The apparatus according to claim 7, wherein the microwave transmitting means is provided with reflection power measuring means for measuring power of reflection waves from the process chamber, said matching means is controlled on the basis of measurement values obtained by the reflection power measuring means, and the impedance of the microwave transmitting means is varied so as to substantially eliminate power of the reflection waves.

10. The apparatus according to claim 7, wherein the matching means is provided with an electric field plane adjusting unit and a magnetic field plane adjusting unit which have, respectively, adjustment pipes comprising said first and second adjustment pipes connected to a rectangular waveguide to corresponds to electric and magnetic field planes perpendicular to each other, and short plates comprising said first and second plates provided movably along the insides of the adjustment pipes.

11. The apparatus according to claim 10, wherein the matching means is provided with moving mechanisms for moving the short plates along the insides of the adjustment pipes.

12. The apparatus according to claim 11, wherein the microwave transmitting means is provided with reflection power measuring means for measuring power of reflection waves from the process chamber, said moving mechanisms are controlled on the basis of measurement values obtained by the reflection power measuring means, and the impedance of the microwave transmitting means is varied so as to substantially eliminate power of the reflection waves.

13. A plasma process apparatus which permits generating microwaves and a magnetic field so as to bring about electron cyclotron resonance and, thus, to generate a plasma which is applied to an object to be processed, comprising:

microwave generating means for generating said microwaves; microwave transmitting means for transmitting the microwaves;

a process chamber having said object arranged therein, the microwaves being introduced into said process chamber through said microwave transmitting means;

process gas supply means for supplying a process gas into said process chamber; and magnetic field generating means for generating a magnetic field within the process chamber, wherein the frequency of the microwave falls within a range between a lower limit of a cutoff frequency determined by the inner diameter of the process chamber and an upper limit of a maximum frequency at which a standing wave of the microwave does not occur on the surface of the object, wherein the upper limit and the lower limit in the frequency range of the microwave are 1.0 GHz and 440 MHz, respectively, where the diameter of the object to be processed is 12 inches and the microwave oscillates in TE 11 mode within the process chamber, wherein the microwave transmitting means is provided with matching means for freely varying the impedance of the microwaves in the microwave transmitting means, and wherein said matching means comprises first and second adjustment pipes connected to said transmitting means having adjustable respective first and second plates disposed perpendicular to each other.

14. The apparatus according to claim 13, wherein the microwave has a frequency of 915 MHz.

15. The apparatus according to claim 13, wherein the microwave transmitting means is provided with reflection power measuring means for measuring power of reflection waves from the process chamber, said matching means is controlled on the basis of measurement values obtained by the reflection power measuring means, and the impedance of the microwave transmitting means is varied so as to substantially eliminate power of the reflection waves.

16. The apparatus according to claim 13, wherein the matching means is provided with an electric field plane adjusting unit and a magnetic field plane adjusting unit which have, respectively, adjustment pipes comprising said first and second adjustment pipes connected to a rectangular waveguide to corresponds to electric and magnetic field planes perpendicular to each other, and short plates comprising said first and second plates provided movably along the insides of the adjustment pipes.

17. The apparatus according to claim 16, wherein the matching means is provided with moving mechanisms for moving the short plates along the insides of the adjustment pipes.

18. The apparatus according to claim 17, wherein the microwave transmitting means is provided with reflection power measuring means for measuring power of reflection waves from the process chamber, said moving mechanisms are controlled on the basis of measurement values obtained by the reflection power measuring means, and the impedance of the microwave transmitting means is varied so as to substantially eliminate power of the reflection waves.

19. A plasma process apparatus which permits generating microwaves and a magnetic field so as to bring about electron cyclotron resonance and, thus, to generate a plasma which is applied to an object to be processed, comprising:

microwave generating means for generating said microwaves; microwave transmitting means for transmitting the microwaves;

a process chamber having said object arranged therein, the microwaves being introduced into said process chamber through said microwave transmitting means;

process gas supply means for supplying a process gas into said process chamber; and magnetic field generating means for generating a magnetic field within the process chamber, wherein the frequency of the microwave falls within a range between a lower limit of a cutoff frequency determined by the inner diameter of the process chamber and an upper limit of a maximum frequency at which a standing wave of the microwave does not occur on the surface of the object, wherein the upper limit and the lower limit in the frequency range of the microwave are 1.0 GHz and 570 MHz, respectively, where the diameter of the object to be processed is 12 inches and the microwave oscillates in TM 01 mode within the process chambers wherein the microwave transmitting means is provided with matching means for freely varying the impedance of the microwaves in the microwave transmitting means, and wherein said matching means comprises first and second adjustment pipes connected to said transmitting means having a adjustable respective first and second plates disposed perpendicular to each other.

20. The apparatus according to claim 19, wherein the microwave has a frequency of 915 MHz.

21. The apparatus according to claim 19, wherein the microwave transmitting means is provided with reflection power measuring means for measuring power of reflection waves from the process chamber, said matching means is controlled on the basis of measurement values obtained by the reflection power measuring means, and the impedance of the microwave transmitting means is varied so as to substantially eliminate power of the reflection waves.

22. The apparatus according to claim 19, wherein the matching means is provided with an electric field plane adjusting unit and a magnetic field plane adjusting unit which have, respectively, adjustment pipes comprising said first and second adjustment pipes connected to a rectangular waveguide to corresponds to electric and magnetic field planes perpendicular to each other, and short plates comprising said first and second plates provided movably along the insides of the adjustment pipes.

23. The apparatus according to claim 22, wherein the matching means is provided with moving mechanisms for moving the short plates along the insides of the adjustment pipes.

24. The apparatus according to claim 23, wherein the microwave transmitting means is provided with reflection power measuring means for measuring power of reflection waves from the process chamber, said moving mechanisms are controlled on the basis of measurement values obtained by the reflection power measuring means, and the impedance of the microwave transmitting means is varied so as to substantially eliminate power of the reflection waves.

* * * * *